(12) United States Patent
Loffink et al.

(10) Patent No.: US 10,522,949 B1
(45) Date of Patent: Dec. 31, 2019

(54) OPTIMIZED PIN PATTERN FOR HIGH SPEED INPUT/OUTPUT

(71) Applicant: QUALCOMM Incorporated, San Diego, CA (US)

(72) Inventors: John Loffink, Wake Forest, NC (US); Chong Ding, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/059,005

(22) Filed: Aug. 8, 2018

(51) Int. Cl.
| H01R 13/6471 | (2011.01) |
| H01R 12/71 | (2011.01) |
| H05K 1/02 | (2006.01) |

(52) U.S. Cl.
CPC ....... *H01R 13/6471* (2013.01); *H01R 12/716* (2013.01); *H05K 1/0228* (2013.01)

(58) Field of Classification Search
CPC .............. H01R 12/718; H01R 13/6471; Y10S 439/941; H05K 1/0245; H05K 1/0251; H05K 1/0228
See application file for complete search history.

(56) References Cited

U.S. PATENT DOCUMENTS

| 5,634,822 | A | * | 6/1997 | Gunell | ................... | H01R 24/58 439/668 |
| 5,852,725 | A | * | 12/1998 | Yen | ....................... | G06F 13/409 710/301 |
| 6,384,341 | B1 | * | 5/2002 | Rothermel | ........... | H05K 1/0222 174/250 |
| 6,438,637 | B1 | * | 8/2002 | Chen | .................... | B23K 3/0638 710/301 |
| 7,160,114 | B2 | * | 1/2007 | Chen | ...................... | H01R 29/00 439/55 |
| 7,445,457 | B1 | * | 11/2008 | Frangioso, Jr. | ........ | H05K 1/115 361/805 |
| 7,497,734 | B2 | * | 3/2009 | Josephson | ............ | H01R 12/724 439/607.05 |
| 7,819,667 | B2 | * | 10/2010 | Kowalski | ............. | H01R 13/514 439/65 |
| 7,867,031 | B2 | * | 1/2011 | Amleshi | ............ | H01R 13/6471 439/607.08 |

(Continued)

OTHER PUBLICATIONS

Li Z-Y., et al., "Pin Assignment Optimization for Large-Scale High-Pin-Count BGA Packages Using Simulated Annealing," IEEE Transactions on Components, Packaging and Manufacturing Technology, Oct. 2016, vol. 6, No. 10, pp. 1465-1474.

*Primary Examiner* — Briggitte R. Hammond
(74) *Attorney, Agent, or Firm* — Muncy, Geissler, Olds & Lowe, P.C./Qualcomm

(57) ABSTRACT

Pin layouts for HSIO require a large number of pins due to isolation requirements. Differential signaling can be used in high speed transmission and reception. A single lane for operation at 6 to 8 Gbps speed typically a total of six to eight pins. At higher speeds, conventional technique to meet isolation requirements is to increase the number of ground pins per lane. With many lanes, the number of pins can become cumbersome. To address such issues, it is proposed to provide pin patterns that leverage differential cancellation to enhance signal isolation so that operation speed can increase while also reducing the number of pins so that the number of pins of a package is less cumbersome.

20 Claims, 11 Drawing Sheets

(56) References Cited

U.S. PATENT DOCUMENTS

| | | | | |
|---|---|---|---|---|
| 7,874,854 B2* | 1/2011 | Cobb | ............ | H01R 13/6485 |
| | | | | 439/181 |
| 8,183,466 B2* | 5/2012 | Morlion | ............ | H05K 1/114 |
| | | | | 174/261 |
| 8,438,524 B1* | 5/2013 | Kohli | ............ | G06F 17/5068 |
| | | | | 716/120 |
| 8,465,302 B2* | 6/2013 | Regnier | ............ | H01R 9/038 |
| | | | | 439/108 |
| 8,674,235 B2* | 3/2014 | Hossain | ............ | H01L 23/49838 |
| | | | | 174/261 |
| 9,106,020 B2* | 8/2015 | Cohen | ............ | H05K 1/115 |
| 9,277,649 B2* | 3/2016 | Ellison | ............ | H01R 12/523 |
| 9,293,798 B2* | 3/2016 | Ye | ............ | H01P 1/227 |
| 9,514,966 B2* | 12/2016 | Fazelpour | ............ | H01L 21/4885 |
| 9,515,429 B2* | 12/2016 | De Geest | ............ | H01R 13/6585 |
| 9,554,455 B2 | 1/2017 | Aihara et al. | | |
| 9,972,566 B2* | 5/2018 | Chen | ............ | H01P 3/026 |
| 10,034,366 B2* | 7/2018 | Gailus | ............ | H05K 1/0222 |
| 10,038,281 B2* | 7/2018 | Wig | ............ | H01R 13/6471 |
| 10,201,074 B2* | 2/2019 | Charbonneau | ............ | H05K 1/0219 |
| 2002/0030979 A1* | 3/2002 | Chang | ............ | H01L 23/50 |
| | | | | 361/780 |
| 2011/0212650 A1* | 9/2011 | Amleshi | ............ | H01R 13/514 |
| | | | | 439/660 |
| 2013/0005160 A1* | 1/2013 | Minich | ............ | H01R 13/6471 |
| | | | | 439/65 |
| 2014/0209370 A1* | 7/2014 | Minich | ............ | G09B 23/183 |
| | | | | 174/266 |
| 2017/0351640 A1 | 12/2017 | Nilange et al. | | |

\* cited by examiner

CONVENTIONAL ART

OPTIMIZED PIN PATTERN FOR HIGH SPEED INPUT/OUTPUT

FIELD OF DISCLOSURE

The disclosure generally relates to pin layouts in semiconductor packages, sockets and PCB layouts including pins, pads and vias, and in particular, to pin layouts with optimized interstitial pin pattern for high speed differential input/output with zero net aggressors.

BACKGROUND

Pin layouts for an HSIO (High Speed Input/Output) require a large number of pins due in large part to isolation requirements. In high speed transmission/reception, differential signaling—which is a technique of transmitting information using complimentary pairs of signals—can be used. A single lane for operation at 6 to 8 Gbps (gigabits per second) speed typically includes one transmit pair of pins for differential signaling and one receive pair of pins also for differential signaling. Also, to meet signal integrity requirements, two to four ground pins are provided for isolation, for a total of six to eight pins per lane.

For higher speeds (25, 32, 50+ Gbps), more ground pins are added for isolation. Future generations of server chip can have many lanes (e.g., 96 to 192 lanes of PCIe (Peripheral Component Interconnect Express), proprietary chip to chip coherent interfaces, 10GE/40GE/100GE (Ten/Forty/One Hundred Gigabit Ethernet), COX (Cache Coherent Interconnect for Accelerators) or GenZ). At current speeds 576 to 1,152 pins may be driven. For yet higher speeds, even more pins will be necessary for additional lanes and to meet signal integrity requirements.

SUMMARY

This summary identifies features of some example aspects, and is not an exclusive or exhaustive description of the disclosed subject matter. Whether features or aspects are included in, or omitted from this summary is not intended as indicative of relative importance of such features. Additional features and aspects are described, and will become apparent to persons skilled in the art upon reading the following detailed description and viewing the drawings that form a part thereof.

An exemplary apparatus is disclosed. The apparatus may comprise a pin pattern. The pin pattern may include a plurality of pins arranged in rows and columns in an interstitial pattern such that pins in each row are offset in a row direction relative to the pins in adjacent rows, and pins in each column are offset in a column direction relative to the pins in adjacent columns. The plurality of pins may comprise a plurality of ground pins, and a plurality of differential signal pairs. Each differential signal pair may comprise a first signal pin and a second signal pin. The first signal pin may be configured to carry a first differential signal, and the second signal pin may be configured to carry a second differential signal complementary to the first differential signal. The first signal pin and/or the second signal pin of each differential signal pair may be an immediate neighbor pin of the first signal pin and/or the second signal pin of at least one other differential signal pair. Also, a net number of aggressor pins may be zero for each of the first and second signal pins of each differential signal pair.

An exemplary method of forming a pin pattern of an apparatus is disclosed. The pin pattern may include a plurality of pins arranged. Forming the pin pattern may comprise forming a plurality of ground pins of the pin pattern. Forming the pin pattern may also comprise forming a plurality of differential signal pairs of the pin pattern such that each differential signal pair comprises a first signal pin configured to carry a first differential signal, and a second signal pin configured to carry a second differential signal complementary to the first differential signal. The pin pattern may be formed such that the plurality of pins are arranged in rows and columns in an interstitial pattern such that pins in each row are offset in a row direction relative to the pins in adjacent rows, and pins in each column are offset in a column direction relative to the pins in adjacent columns. The plurality of differential signal pairs may be arranged such that the first signal pin and/or the second signal pin of each differential signal pair may be an immediate neighbor pin of the first signal pin and/or the second signal pin of at least one other differential signal pair, and such that a net number of aggressor pins may be zero for each of the first and second signal pins of each differential signal pair.

BRIEF DESCRIPTION OF THE DRAWINGS

The accompanying drawings are presented to aid in the description of examples of one or more aspects of the disclosed subject matter and are provided solely for illustration of the examples and not limitation thereof.

DETAILED DESCRIPTION

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, processes, operations, elements, and/or components, but do not preclude the presence or addition of one or more other features, integers, processes, operations, elements, components, and/or groups thereof.

Recall from above that pin layouts for HSIO (High Speed Input/Output) require a large number of pins due to isolation requirements. Differential signaling can be used in high speed transmission/reception. A single lane for operation at 6 to 8 Gbps (gigabits per second) speed typically includes a total of six to eight pins—one pair of transmit pins, one pair of receive pins, and two to four ground pins for isolation.

At higher operation speeds (e.g., 25, 32, 50+ Gbps), the number of pins per lane normally increases. This is due to the number of ground pins being increased to meet isolation requirements so that the signal integrity can be maintained. Also, chips can have many lanes e.g., 96 to 192 lanes of PCIe (Peripheral Component Interconnect Express, proprietary chip to chip coherent interfaces, 10GE/40GE/100GE (Ten/Forty/One Hundred Gigabit Ethernet), COX (Cache Coherent Interconnect for Accelerators) or GenZ). At current speeds 576 to 1,152 pins may be driven. As the speed continues to increase, meeting the necessary signal integrity requirements will require even more pins.

Figure 1:
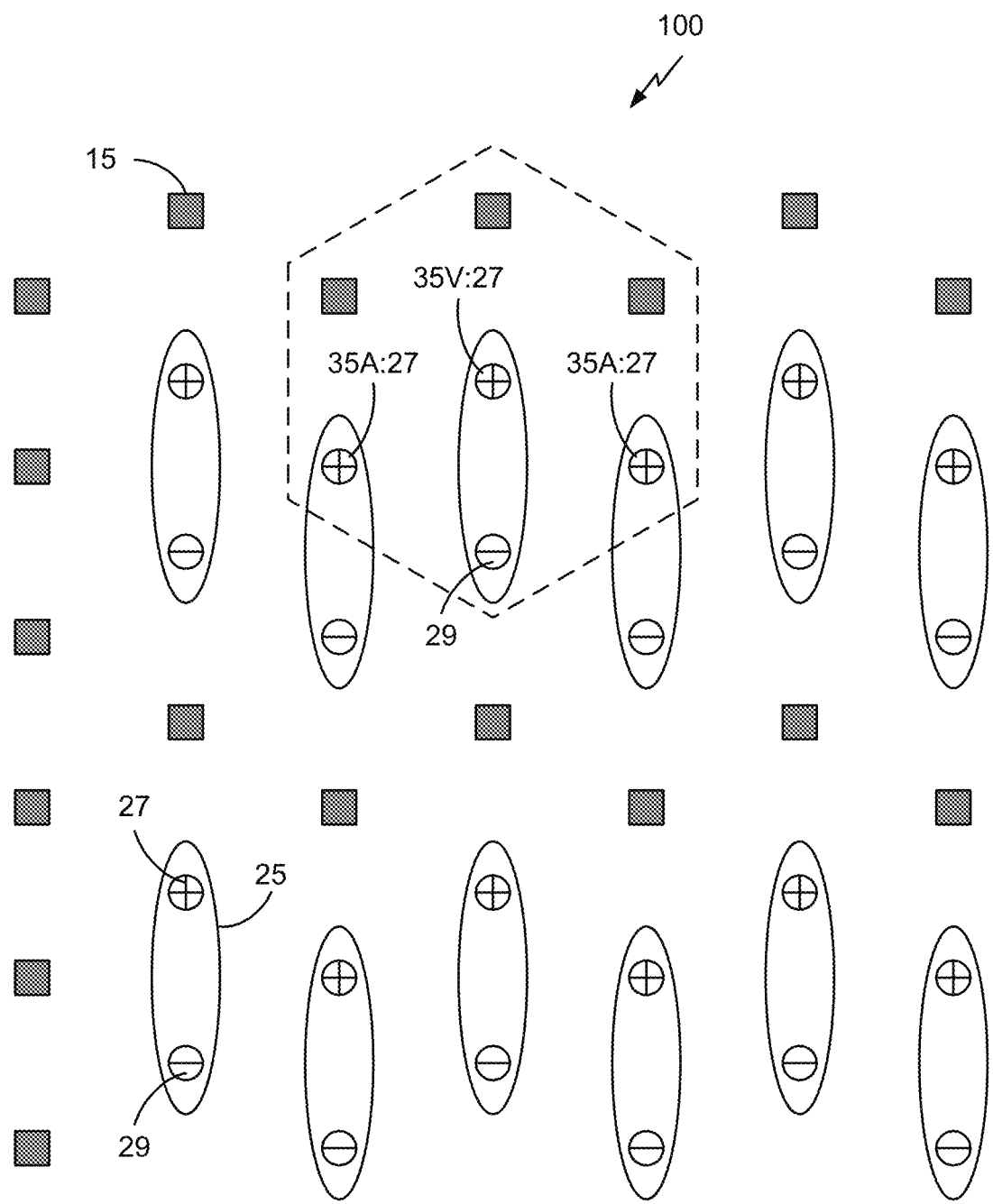
FIG. 1 illustrates a conventional pin pattern for PCIe (Peripheral Component Interconnect Express)

FIG. 1 illustrates a conventional PCIe pin pattern 100. Not all of the pins are shown. That is, a representative portion of the pinout of the PCIe packages is shown in FIG. 1. The pin pattern 100 includes a plurality of ground pins 15 and a plurality of differential signal pairs 25. Each differential signal pair 25 includes two signal pins—a first signal pin 27 carrying a first differential signal and a second signal pin 29 carrying a second differential signal complementary to the first differential signal. As seen, the pin pattern 100 has side-by-side differential signal pairs 25. In this pin layout, the signal-to-pin ratio is 0.67 including the upper rows of isolating ground pins 15. For a 2×16 HSIO segment, the total number of pins can be as high as 260 including all ground isolation rows and columns.

In the pin pattern 100, due to the side-by-side nature of the differential signal pairs 25, signal pins 27, 29 may be victims of as many as two aggressors. In FIG. 1, a dashed hexagon is drawn centered on a victim pin 35V. This particular victim pin 35V is the first signal pin 27 of one of the differential signal pairs 25 (hence the label "35V:27"). As seen, the victim pin 35V has six immediate neighbor pins. Three of the immediate neighbor pins are ground pins 15, and therefore do not interfere with the signal carried on the victim pin 35V. The second signal pin 29 of the same differential signal pair 25 also does not interfere since the signal it carries is complementary to the signal carried by the victim pin 35V.

However, two of the immediate neighbor pins are aggressor pins 35A to the victim pin 35V. In this instance, the two aggressor pins 35A are first signal pins 27 of two other differential signal pairs 25 (hence the label "35A:27"). The two aggressor pins 35A:27 can interfere with the victim pin 35V:27. This is because the signals carried on these aggressor pins 35A:27 are different from the signal carried by the victim pin 35V, and therefore can cause uncorrelated crosstalk at the victim pin 35V:27, i.e., the victim pin 35V:27 can experience interference from the aggressor pins 35A:27. To state it another way, the signal carried on the victim pin 35V:27 may be interfered with by the signals carried on the aggressor pins 35A:27.

Based on the discussion, aggressor and victim pins may be defined as follows. An aggressor pin (or simply "aggressor") may be a signal pin whose signal it carries interferes with signals carried on one or more immediate neighbor pins. A victim pin (or simply "victim") may be viewed as a signal pin whose signal it carries is interfered with by signals carried on one or more immediate neighbor pins.

It is seen that a signal pin 27, 29 can be both an aggressor and a victim at the same time. For example, recall that in FIG. 1, the pin 35V:27 is the first signal pin 27 of one of the differential signal pairs 25, can be interfered with by the two pins 35A:27, which are the first signal pins 27 of two other differential signal pairs 25. However, the same pin 35V:27 can also interfere with the pins 35A:27 of the two other differential signal pairs 25.

Figure 2:
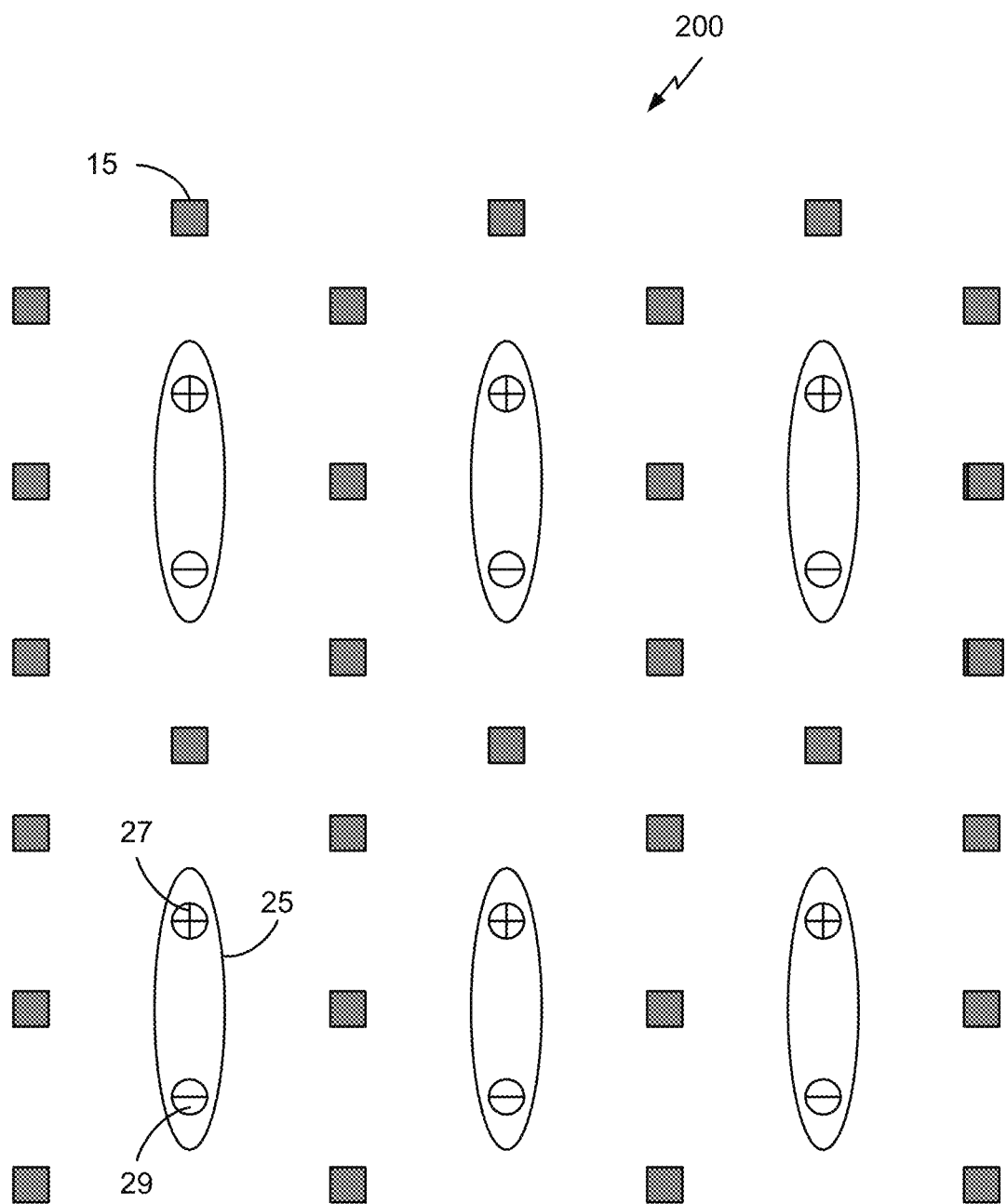
FIG. 2 illustrates a conventional pin pattern for higher speed interfaces running at speeds greater than the PCIe pin pattern of FIG. 1.

The pin pattern 100 is typically used for speeds between 10 and 16 Gbps. However, for higher speeds, the pin pattern 100 may be insufficient due to the amount of crosstalk generated. For higher speeds, greater isolation is needed. A conventional pin pattern 200 illustrated in FIG. 2 is able to provide the greater isolation. The pin pattern 200 can be used for conventional 25 Gbps or higher speeds for COX (Cache Coherent Interconnect for Accelerators), PCIe Gen 5 at 32 Gbps or Gen-Z. Again, only a representative portion of the full pinout is shown in FIG. 2. The pin pattern 200 includes a plurality of ground pins 15 and a plurality of differential signal pairs 25, with each differential signal pair 25 comprising first and second signal pins 27, 29 carrying complementary first and second differential signals.

As mentioned, the pin pattern 200 improves signal isolation over the pin pattern 100, and thus can improve speed. It is seen that none of the signal pins 27, 29 in the pin pattern 200 have any immediate neighbor pins carrying uncorrelated signals, i.e., the number of aggressors is zero for any of the signal pins 27, 29. Such high isolation is arrived at through additional ground pins 15 to separate the differential signal pairs 25 from each other.

While the additional ground pins 15 provide high isolation, it also has the unfortunate effect of increasing the total number of pins. The result is that the signal-to-pin ratio is rather low at 0.40 counting the upper rows of isolating ground pins 15. For a 2×16 HSIO segment, the total number of pins for the pin pattern 200 can be as high as 412, which is an increase of 152 pins over the pin pattern 100. As an aside, the pin count of the pin pattern 200 is not twice the pin count of the pin pattern 100 since a row of ground pins 15 is removed with the offset pairs between rows.

It is then seen that neither of the conventional pin patterns 100, 200 is optimal. The pin pattern 100 is advantageous in that a relatively high signal-to-pin ratio of 0.67 can be achieved, but is disadvantageous in that a significant number of signal pins 27, 29 experience interferences. On the other hand, the pin pattern 200 is advantageous in that the number of aggressors is zero for any signal pin 27, 29, but the pin count is high.

Figure 3A:
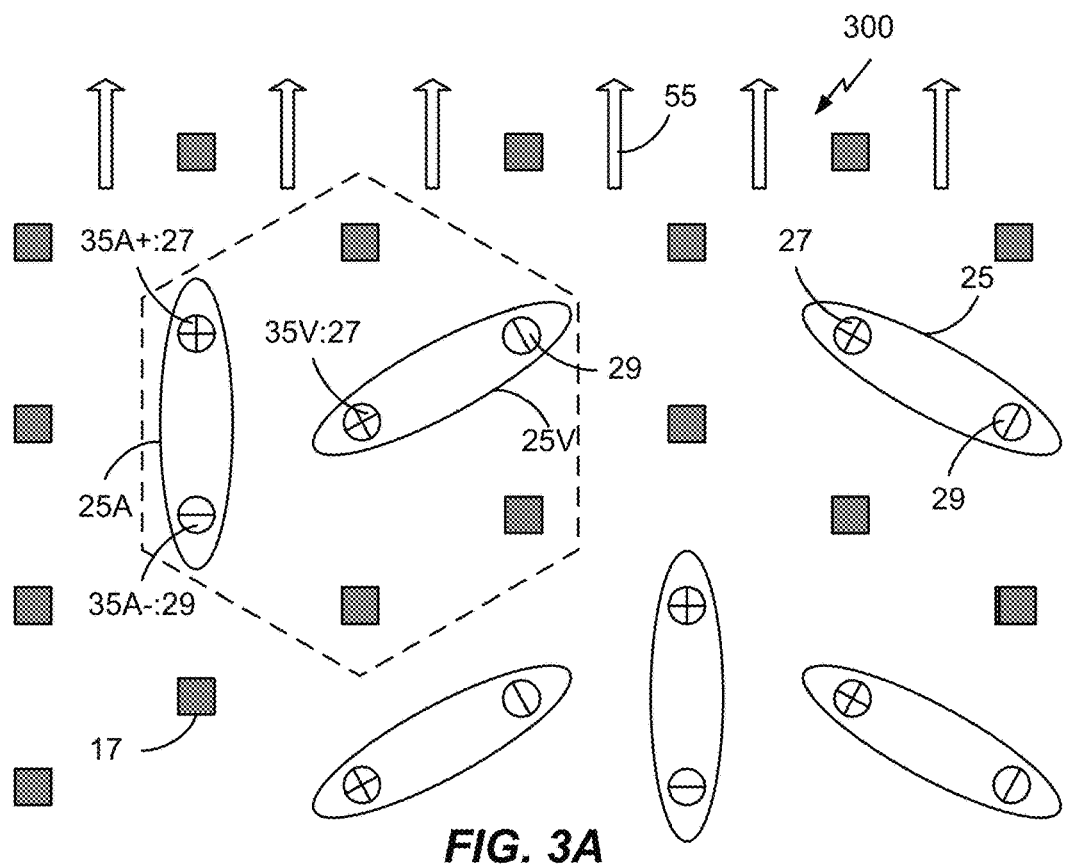
FIGS. 3A and 3B illustrate an example pin pattern that leverages differential cancellation to arrive at net zero aggressors.
Figure 3B:
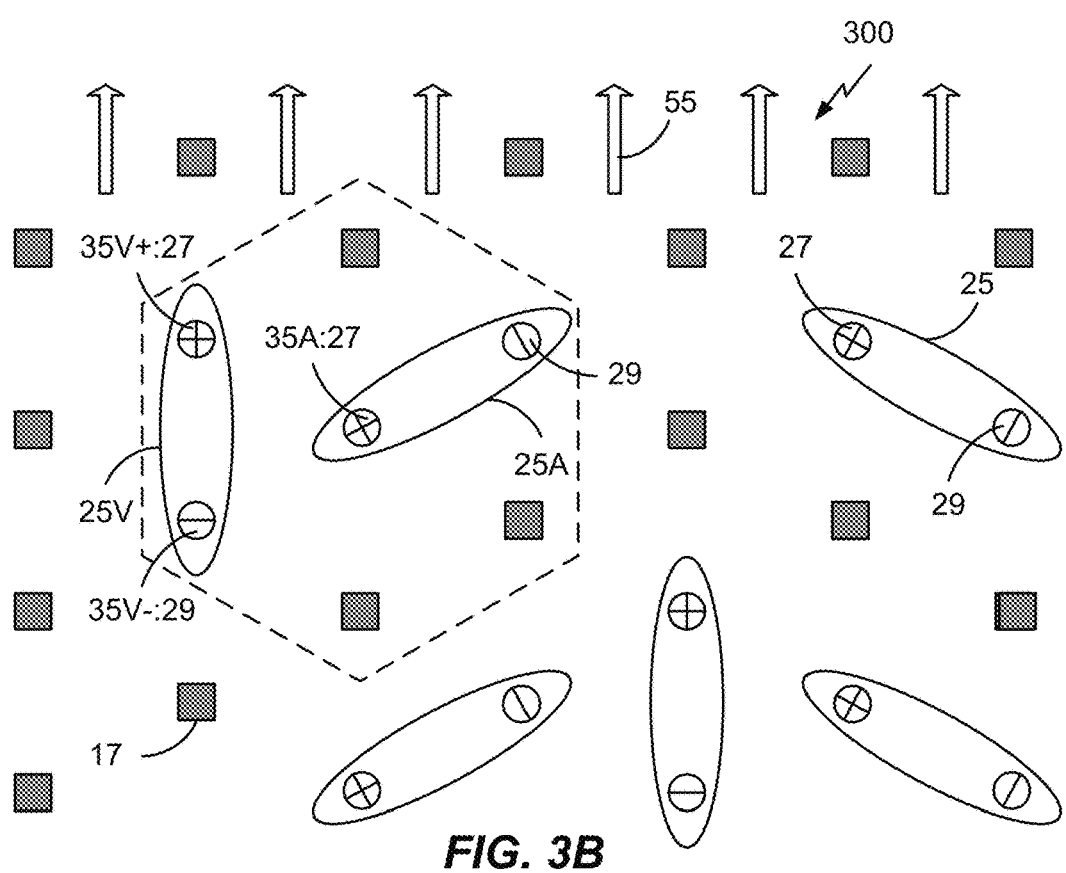

To address at least these issues related to the conventional pin patterns, it is proposed to leverage "differential cancellation" to achieve pin patterns that have relatively high signal-to-pin ratio (e.g., greater than 0.40) and also have zero "net" aggressors. FIGS. 3A and 3B illustrate an example pin pattern 300 that takes advantage of differential cancellation to achieve a relatively high signal-to-pin ratio with zero net aggressors. The illustrated pin pattern 300 is identical in both FIGS. 3A and 3B, i.e., they can be viewed as being one and the same. But as will be explained further below, the two figures will be used to explain different aspects of the "differential cancellation".

The illustrated pin pattern 300 may be a pattern of a pinout of a semiconductor package such as an SoC (systemon-chip). The pin pattern 300 may include a plurality of isolation pins 17 and a plurality of differential signal pairs 25. For isolation of signal pairs, ground, power or any isolating plane can be used for isolation, or any combination of these planes. Thus, each isolation pin 17 may be a ground pin, a power pin, or pin coupled to an isolating plane. Each differential signal pair 25 may include two signal pins—a first signal pin 27 carrying a first differential signal and a second signal pin 29 carrying a second differential signal complementary to the first differential signal.

Not all pins are shown in FIGS. 3A and 3B. For example, the illustrated pin pattern 300 may be a representative portion of an exemplary 2×16 HSIO segment. The pin pattern 300 may be repeated horizontally and/or vertically. With the proposed pin pattern 300, the signal-to-pin ratio of the example package may be 0.50 or higher, which is greater than that of the pin pattern 200. The pin count for the package may be 336 or lower, which includes all ground isolation rows and columns. This represents a reduction of at least 76 pins relative to the pin pattern 200 for the same 2×16 segments.

The plurality of pins (isolation pins 17, signal pins 27, 29) maybe arranged in an interstitial pattern. That is, the pins may be arranged in rows and columns such that the pins in each row are staggered or offset in a row direction relative to the pins in adjacent rows, and the pins in each column are staggered or offset in a column direction relative to pins in adjacent columns.

The pins of the pin pattern 300 may have immediate neighbor pins. Preferably, for each pin that has a plurality of immediate neighbor pins, that pin is equidistant or substantially equidistant from each of its immediate neighbor pins. Also preferably, a distance between any two immediate neighbor pins is equal to a distance between any other two immediate neighbor pins. This equidistance characteristic can be met when the plurality of pins are arranged in a hexagonal manner as illustrated in FIGS. 3A, 3B.

Differential cancellation can be viewed as a technique to cancel or otherwise offset the crosstalk effect of one aggressor by another aggressor, i.e., the two aggressors "net" to zero. Then even if a victim pin 35V (a signal pin 27, 29) has multiple aggressors 35A as its immediate neighbor pins, their crosstalk effects may be canceled so as to reduce the net number of aggressors 35A. By utilizing differential cancellation, a pin pattern can be designed that simultaneously improves signal integrity and reduces pin count.

Differential cancellation is not dependent on the orientation of the normal and complementary signal in the pair, therefore any of the patterns shown can swap the assignment of normal and complementary signal while retaining the low crosstalk amounts.

For explanation purposes, a dashed hexagon in FIG. 3A is drawn centered on a victim pin 35V. This particular victim pin 35V is the first signal pin 27 of one of the differential signal pairs 25. For clarity, the victim pin is labeled "35V: 27" and the associated differential signal pair is labeled "25V". As seen, the victim pin 35V:27 has six immediate neighbor pins. Three of the immediate neighbor pins are isolation pins 17, and therefore do not interfere with the signal carried on the victim pin 35V:27. One of the immediate neighbor pins is the second signal pin 29 of the same differential signal pair 25V, and therefore also will not interfere.

On the other hand, the remaining two immediate neighbor pins are signal pins 27, 29 of another differential signal pair 25 meaning that each of the signal pins 27, 29 of the other differential signal pair 25 can individually affect the victim pin 35V:27. In other words, the signal pins 27, 29 of the other differential signal pair 25 can be individually viewed as being an aggressor to the victim pin 35V:27.

However, recall that the signals carried by the signal pins 27, 29 of the other differential signal pair 25 are complementary to each other. To indicate this complementary nature as well as to indicate that they are aggressors, the signal pins 27 and 29 of this other differential signal pair 25 are respectively labeled "35A+:27" and "35A−:29", and the associated differential signal pair is labeled "25A". Since the signals carried on the aggressor pins 35A+:27 and 35A−:29 are complementary, they have opposite crosstalk effects on the victim pin 35V:27. Also recall that the victim pin 35V:27 is equidistant or substantially equidistant from the aggressor pins 35A+:27, 35A−:29. This means that the magnitudes of the crosstalk effects on the victim pin 35V:27 are equal or substantially equal. Taken together, the crosstalk effects of the signals of the aggressor pins 35A+:27, 35A−:29 on the victim pin 35V:27 cancel each other, i.e., their net effect is zero or substantially zero. In short, the net number of aggressors is zero to the signal pin 35V:27 in the center of the hexagon.

FIG. 3A may be viewed as depicting a situation in which a signal pin (one of first and second signal pins 27, 29) of a differential signal pair 25 has as its immediate neighbor pins both signal pins 27, 29 of an other differential signal pair 25. For sake of clarity, assume that in FIG. 3A, a first crosstalk effect is defined as a crosstalk effect due to a signal carried on a first signal pin 27 (e.g., 35A+:27) of the other differential signal pair 25 (e.g., aggressor differential signal pair 25A). Also assume that a second crosstalk effect is defined as a crosstalk effect due to a signal carried on a second signal pin 29 (e.g., 35A−:29) of the same other differential signal pair 25 (e.g., aggressor differential signal pair 25A). In this circumstance, the first and second crosstalk effects cancel each other at the signal pin (e.g., 35V:27) of the differential signal pair 25 (e.g., victim differential signal pair 25V).

Also recall that a victim may also be an aggressor and vice versa. In FIG. 3B, the same pin pattern 300 is illustrated, except that the aggressor-victim roles of the same signal pins are reversed as follows:

FIG. 3A victim differential signal pair 25V↔FIG. 3B aggressor differential signal pair 25A;

FIG. 3A aggressor differential signal pair 25A↔FIG. 3B victim differential signal pair 25V;

FIG. 3A victim pin 35V:27↔FIG. 3B aggressor pin 35A:27;

FIG. 3A aggressor pin 35A+:27↔FIG. 3B victim pin 35V+:27; and

FIG. 3A aggressor pin 35A−:29↔FIG. 3B victim pin 35V−:29.

In FIG. 3B, the aggressor pin 35A:27 has same or substantially the same effect (e.g., same polarity, same magnitude) on both victim pins 35V+:27, 35V−:29. This is because the aggressor pin 35A:27 is equidistant or substantially equidistant from both victim pins 35V+:27, 35V−:29. However, since the signals on the victim pins 35V+:27, 35V−: 29 carry complementary signals, then the effect on one of the victim pins (e.g., on the pin 35V+:27) will be canceled by the effect on the other of the victim pins (e.g., on the 35V−:29). Therefore, the effect on the differential signal carried by the victim differential signal pair 25V will be zero or substantially zero.

FIG. 3B may be viewed as depicting a situation in which both signal pins 27, 29 of a differential signal pair 25 have as their immediate neighbor pins a signal pin (one of first and second signal pins 27, 29) of an other differential signal pair 25. In this instance, the first and second crosstalk effects may be defined slightly different. That is, the first crosstalk effect may be defined as a crosstalk effect due to a signal carried on a signal pin (e.g., 35A:27) of the other differential signal pair 25 (e.g., aggressor differential signal pair 25A) and experienced at a first signal pin 27 (e.g., 35V+:27) of the differential signal pair 25 (e.g., victim differential signal pair 25V). The second crosstalk effect may be defined as a crosstalk effect due to the signal carried on the same signal pin (e.g., 35A:27) of the same other differential signal pair 25 (e.g., aggressor differential signal pair 25A) and experienced at a second signal pin 29 (e.g., 35V−:29) of the same differential signal pair 25 (e.g., victim differential signal pair 25V). Taken together, the first and second crosstalk effects are canceled at the differential signal pair 25 (e.g., victim differential signal pair 25V).

The illustrated pin pattern 300 in FIGS. 3A and 3B leverages the differential cancellation to reduce the number of aggressors, while also keeping the pin count low. Note that even though the signal pins 27, 29 of the differential signal pairs 25 of the pin pattern 300 have signal pins 27, 29 of other differential signal pairs 25 as immediate neighbor pins, the number of aggressors nets to zero for all signal pins 27, 29. This net zero aggressor result is achieved without resorting to individually isolating each differential signal pair with isolation pins 17 as in the conventional pin pattern 200.

Figure 4:
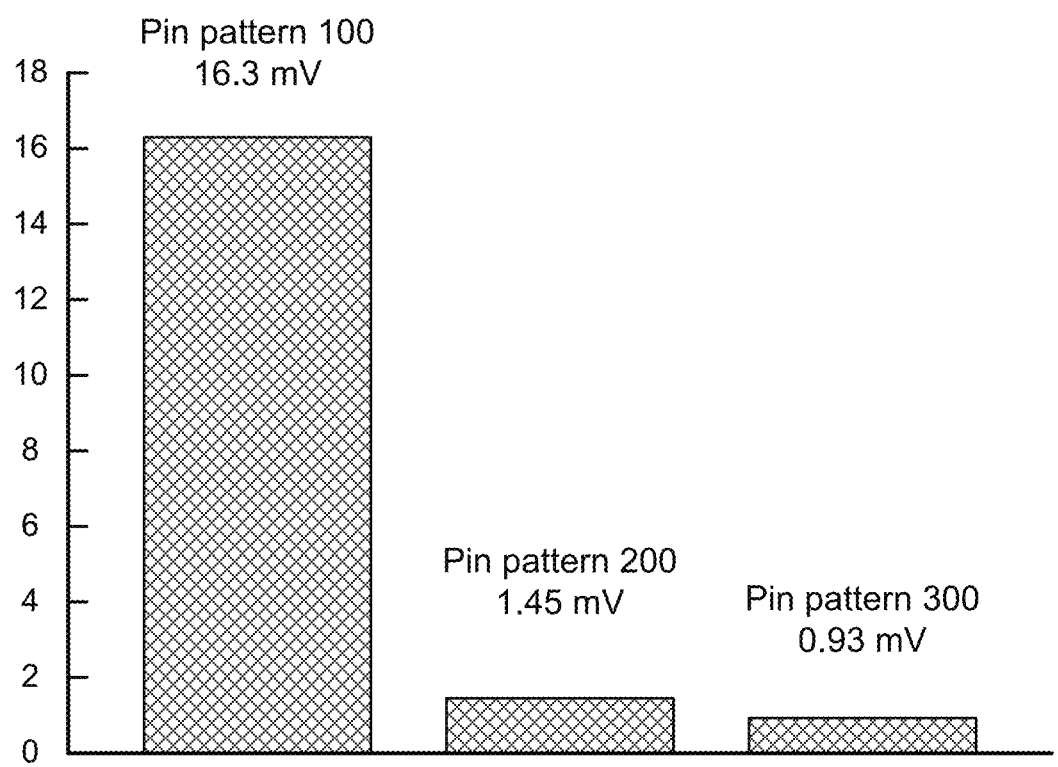
FIG. 4 is a graph that compares crosstalk noise among different pin patterns.

FIG. 4 is a graph that compares the crosstalk noise among the pin patterns 100, 200, 300. Between the conventional pin patterns 100, 200, the noise is much less in the pin pattern 200. This is expected since the pin pattern 200 provides many more ground pins 15 to provide isolation.

However, the pin pattern 300 has the lowest noise of all. The pin pattern 300 achieves lower noise than the conventional pin pattern 200 despite having fewer pins. This means that the pin pattern 300 is more signal-to-pin efficient than the pin pattern 200 in addition to achieving better crosstalk.

The pin pattern 300 provides another advantage. Note that there are six differential signal pairs 25 illustrated in FIGS. 3A and 3B. Also illustrated are six arrows exiting the top of the pin pattern 300. These arrows indicate routing paths 55 for the six differential signal pairs 25 so that the signals from the differential signal pairs 25 may be provided outside of the semiconductor package. Each routing path 55 may be located in between two columns of pins. In this instance, there are six such in-between column locations. Therefore, the routing is relatively straightforward.

The routing paths 55 may be provided in a layer of the package (e.g., layer of PCB (printed circuit board)) allowed due to a reduction in the number of isolation pins 17, e.g., relative to the conventional pin pattern 200. Because of the reduction in the number of isolation pins 17, the portion of the layer devoted to routing the isolation pins 17 can be reduced, and consequently, the portion of the layer for routing the differential signals can be increased. Due to this routing feature, the pin pattern 300 may also be referred to as a "first routable net aggressor of zero" pattern 300.

FIGS. 5, 6, 7 and 8 respectively illustrate other example pin patterns 500, 600, 700 and 800 that leverage differential cancellation to arrive at net zero aggressors. The pin patterns 500-800 may each be a pin pattern of a semiconductor package such as an SoC (system-on-chip). Each of the pin patterns 500-800 may include a plurality of isolation pins 17 and a plurality of differential signal pairs 25. Each differential signal pair 25 may include two signal pins—a first signal pin 27 carrying a first differential signal and a second signal pin 29 carrying a second differential signal complementary to the first differential signal.

For each of the pin patterns 500-800, the plurality of pins (isolation pins 17, signal pins 27, 29) may be arranged in an interstitial pattern. That is, the pins may be arranged in rows and columns such that the pins in each row are staggered or offset in a row direction relative to the pins in adjacent rows, and the pins in each column are staggered or offset in a column direction relative to pins in adjacent columns.

The pins of each of the pin patterns 500-800 may have immediate neighbor pins. Preferably, for each pin that has a plurality of immediate neighbor pins, that pin is equidistant or substantially equidistant from each of its immediate neighbor pins. Also preferably, a distance between any two immediate neighbor pins is equal to a distance between any other two immediate neighbor pins. The equidistant characteristic is particularly highlighted in FIG. 8.

Figure 5:
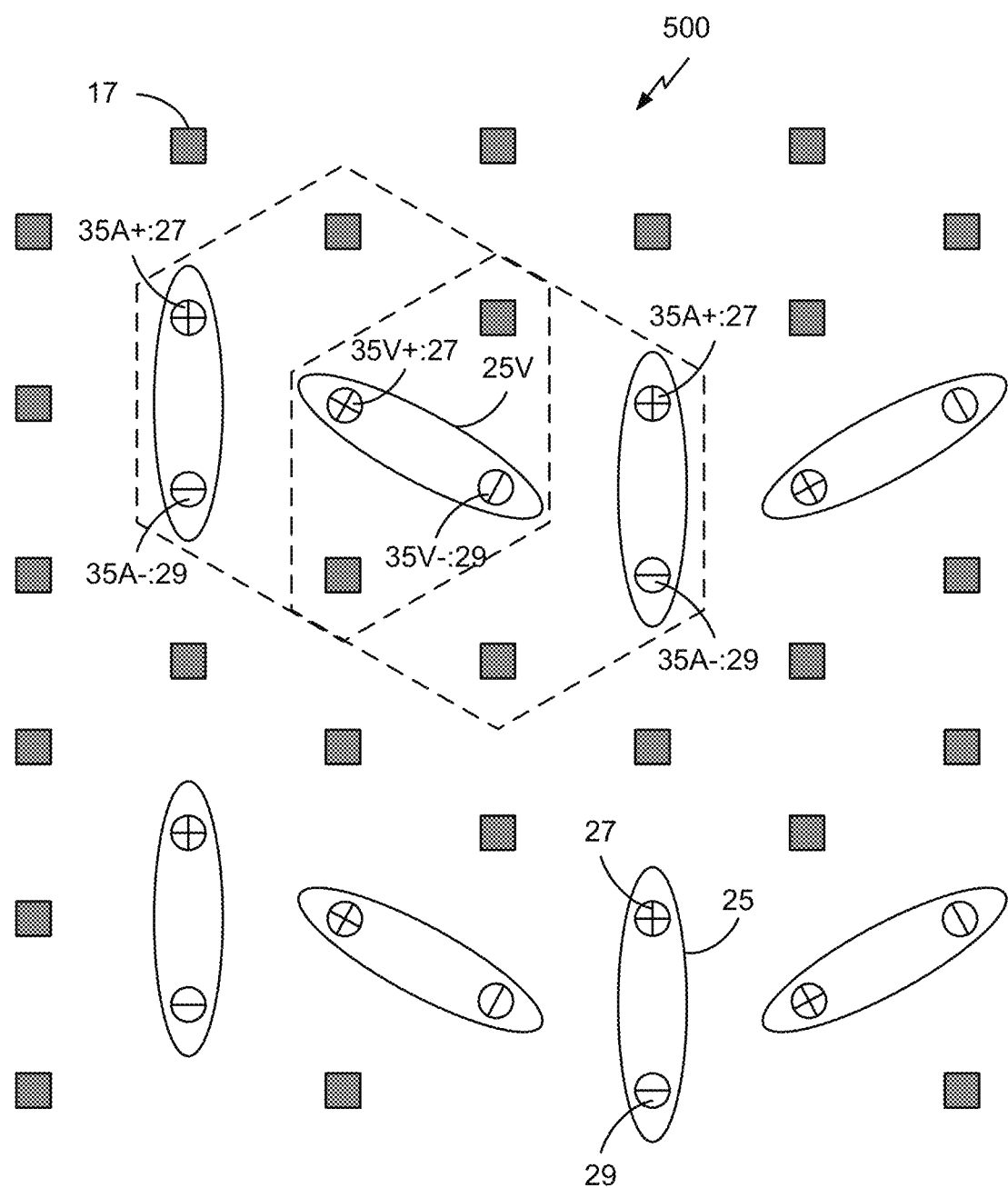
FIGS. 5-8 illustrate other example pin patterns that leverage differential cancellation.

The pin pattern 500 is illustrated in FIG. 5. Not all pins of the semiconductor package are shown. That is, the illustrated pin pattern 500 may be a representative portion of a pinout of an exemplary 2×16 HSIO segment. The pin pattern 500 may be repeated horizontally and/or vertically. With the proposed pin pattern 500, the signal-to-pin ratio of the example package may be 0.44 or higher, which is greater than that of the pin pattern 200. The pin count for the package utilizing the pin pattern 500 may be 384 or lower, which includes all ground isolation rows and columns. This represents a reduction of at least 28 pins relative to the pin pattern 200 for the same 2×16 segments.

In FIG. 5, two dashed hexagons are drawn—one hexagon centered on the first signal pin 35V+:27 of a victim differential signal pair 25V and the other hexagon centered on the second signal pin 35V−:29 of the same victim differential signal pair 25V. Note that the number of aggressors nets to zero for the first signal pin 35V+:27. Also note that the number of aggressors nets to zero also for the second signal pin 35V−:29. This demonstrates the following: one or both of the first and second signal pins 27, 29 of a differential signal pair 25 may have aggressors as immediate neighbors. However, for both signal pins 27, 29 of the differential signal pair 25, the number of aggressors nets to zero. Since the pin pattern 500 takes advantage of the differential cancellation to net out the aggressors, the pin pattern 500 may be referred to as a "net aggressor of zero" pattern 500.

While not illustrated, the pin pattern 500 may also include routing paths 55. In FIG. 5, eight differential signal pairs 25 are illustrated. However, there are still six "in-between column" locations. Therefore, routing of the differential signal pairs 25 of the pin pattern 500 may be less straightforward relative to the pin pattern 300.

Figure 6:
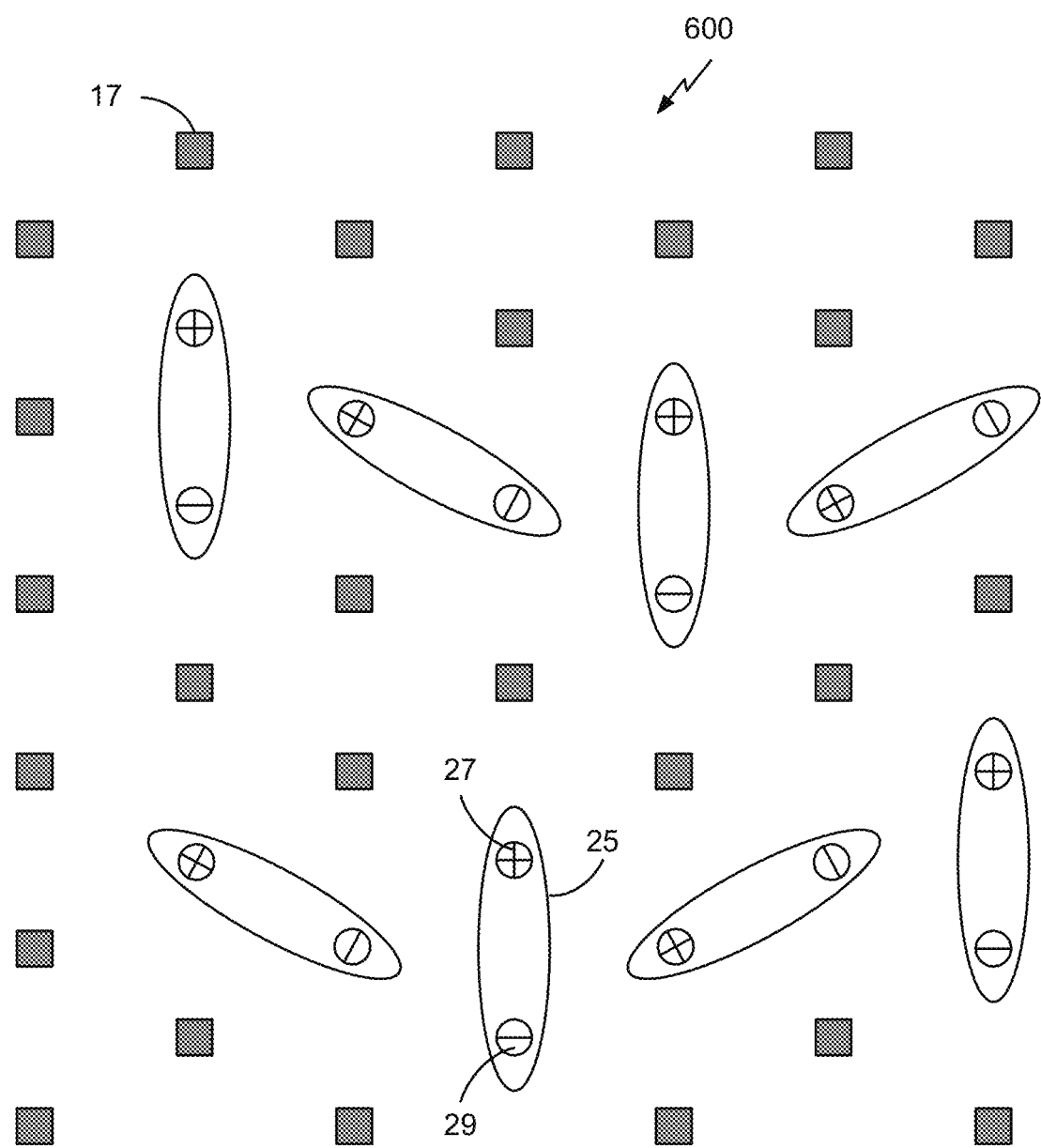

The pin pattern 600 is illustrated in FIG. 6. Not all pins are shown in FIG. 6. That is, the illustrated pin pattern 600 may be a representative portion of a pinout of an exemplary 2×16 HSIO segment. The pin pattern 600 may be repeated horizontally and/or vertically. With the proposed pin pattern 600, the signal-to-pin ratio of the example package may be 0.48 or higher, which is greater than that of the pin pattern 200 and slightly better than the pin pattern 500 of FIG. 5. The pin count for the package utilizing the pin pattern 600 may be 342 or lower, which includes all ground isolation rows and columns. This represents a reduction of at least 70 pins relative to the pin pattern 200 for the same 2×16 segments.

So as to reduce clutter, the hexagons and labels for the victim pins (e.g., 35V+, 35V−) and aggressor pins (e.g., 35A+, 35A−) are not included in FIG. 6. Nonetheless, it is seen that the signal pins 27, 29 of multiple differential signal pairs 25 have as immediate neighbor pins the signal pins 27, 29 of other differential signal pairs 25. In other words, the signal pins 27, 29 of the pin pattern 600 are both victims of and aggressors to other signal pins 27, 29. However, it is also seen that the arrangement of the pin pattern 600 is such that the aggressors net to zero for these signal pins 27, 29.

Note that the pin pattern 600 is similar in some ways to the pin pattern 500. Both pin patterns 500, 600 include eight differential signal pairs 25. Also, the upper row of four differential signal pairs 25 of both pin patterns 500, 600 are arranged in the same locations and in the same orientations. However, the lower row of four differential signal pairs 25 of the two pin patterns 500, 600 are slightly different. The arrangement of the pin pattern 600 better optimizes the isolation pins 17 between the upper and lower rows of the differential signal pairs 25. Hence the pin pattern 600 may be referred to as an "optimized net aggressor of zero" pattern 600.

Figure 7:
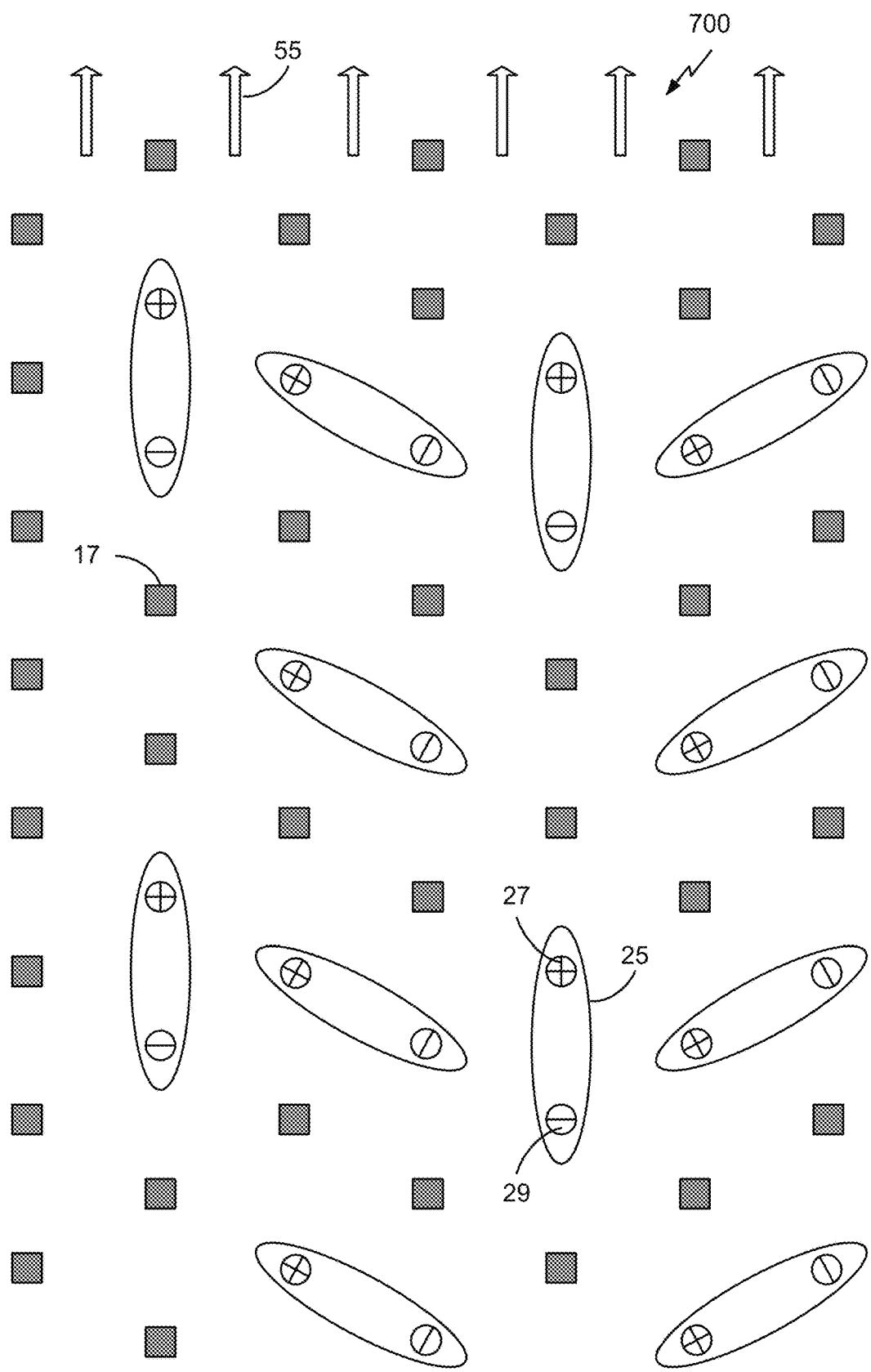

The pin pattern 700 is illustrated in FIG. 7. Not all pins are shown in FIG. 7. That is, the illustrated pin pattern 700 may be a representative portion of a pinout of an exemplary 2×16 HSIO segment. The pin pattern 700 may be repeated horizontally and/or vertically. With the proposed pin pattern 700, the signal-to-pin ratio of the example package may be 0.47 or higher, which is greater than that of the pin pattern 200. The pin count for the package utilizing the pin pattern 700 may be 355 or lower, which includes all ground isolation rows and columns. This represents a reduction of at least 57 pins relative to the pin pattern 200 for the same 2×16 segments.

So as to reduce clutter, the hexagons and labels for the victim pins (e.g., 35V+, 35V−) and aggressor pins (e.g., 35A+, 35A−) are not drawn in FIG. 7. Nonetheless, it is seen the signal pins 27, 29 of multiple differential signal pairs 25 have as immediate neighbor pins signal pins 27, 29 of other differential signal pairs 25. In other words, many of the signal pins 27, 29 are both victims of and aggressors to other signal pins 27, 29. However, it is also seen that the arrangement of the pin pattern 700 is such that the aggressors net to zero for these signal pins 27, 29.

Similar to the pin pattern 300 of FIG. 3, the pin pattern 700 may also provide routing paths 55 for the differential signal pairs 25 in a single layer. Therefore, the pin pattern 700 may be referred to as a "second routable net aggressor of zero" pattern 700.

Figure 8:
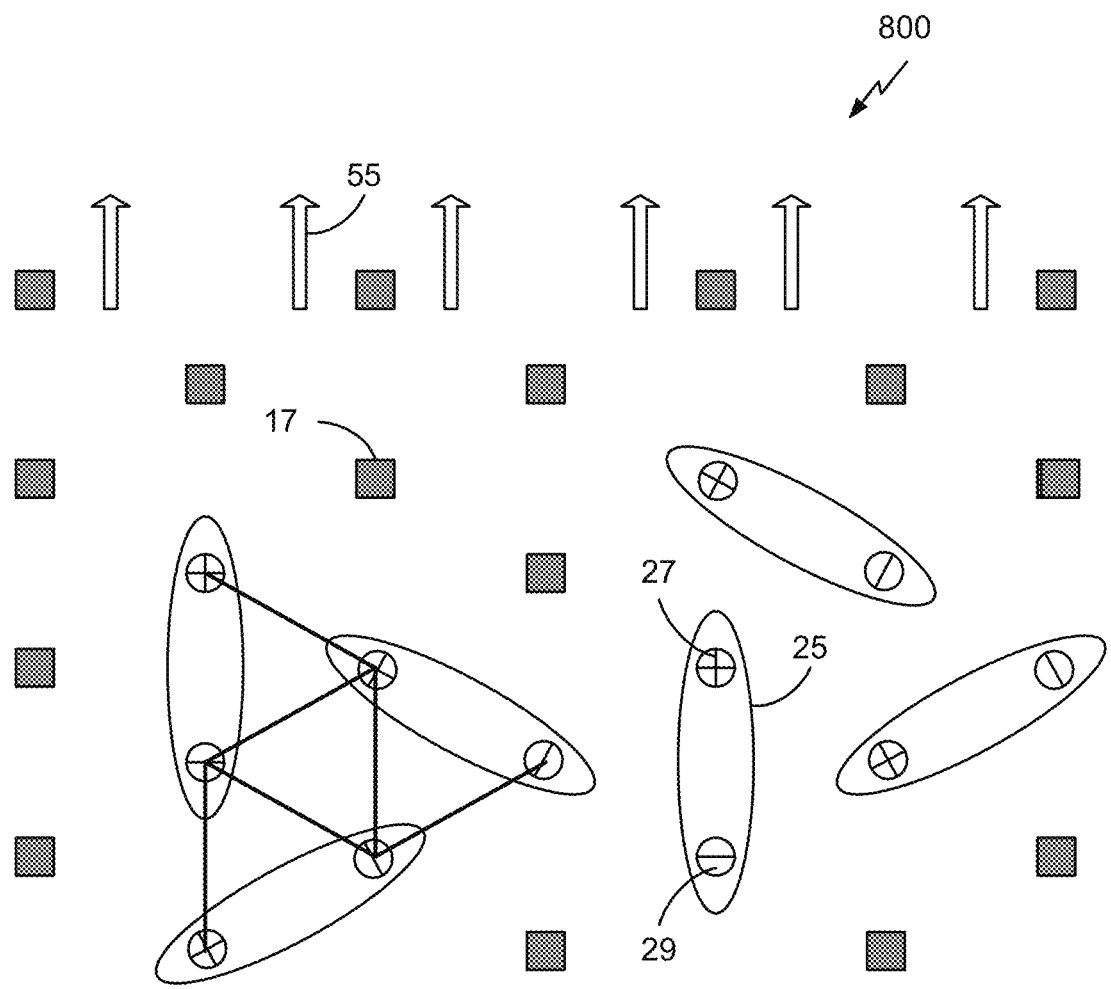

The pin pattern 800 is illustrated in FIG. 8. Not all pins are shown in FIG. 8. That is, the illustrated pin pattern 800 may be a representative portion of a pinout of an exemplary 2×16 HSIO segment. The pin pattern 800 may be repeated horizontally and/or vertically. With the proposed pin pattern 800, the signal-to-pin ratio of the example package may be 0.50 or higher, which is greater than that of the pin pattern 200. The pin count for the package utilizing the pin pattern 800 may be 336 or lower, which includes all ground isolation rows and columns. This represents a reduction of at least 76 pins relative to the pin pattern 200 for the same 2×16 segments.

The pins of the pin pattern 800 may have immediate neighbor pins. Preferably, for each pin that has a plurality of immediate neighbor pins, that pin is equidistant or substantially equidistant from each of its immediate neighbor pins. Also preferably, a distance between any two immediate neighbor pins is equal to a distance between any other two immediate neighbor pins. This is particularly highlighted in the pin pattern 800. Note that the among the three differential signal pairs 25 on the left, each signal pin 27, 29 of a differential signal pair 25 is equidistant to all immediate neighbor signal pins 27, 29 of other differential signal pairs 25.

So as to reduce clutter, the hexagons and labels for the victim pins (e.g., 35V+, 35V−) and aggressor pins (e.g., 35A+, 35A−) are not drawn in FIG. 8. Nonetheless, it is seen the signal pins 27, 29 of multiple differential signal pairs 25 have as immediate neighbor pins signal pins 27, 29 of other differential signal pairs 25. In other words, many of the signal pins 27, 29 are both victims of and aggressors to other signal pins 27, 29. However, it is also seen that the arrangement of the pin pattern 800 is such that the aggressors net to zero for these signal pins 27, 29.

Similar to the pin patterns 300 and 700 of FIGS. 3A, 3B and 7, the pin pattern 800 may also provide routing paths 55 for the differential signal pairs 25 in a single layer. Moreover, the differential signal pairs 25 in the pin pattern 800 are arranged very close to one another, i.e., in a compressed fashion, so that the number of isolation pins 17 can be reduced even further. Therefore, the pin pattern 800 may also be referred to as a "compressed routable net aggressor of zero" pattern 800.

Figure 9:
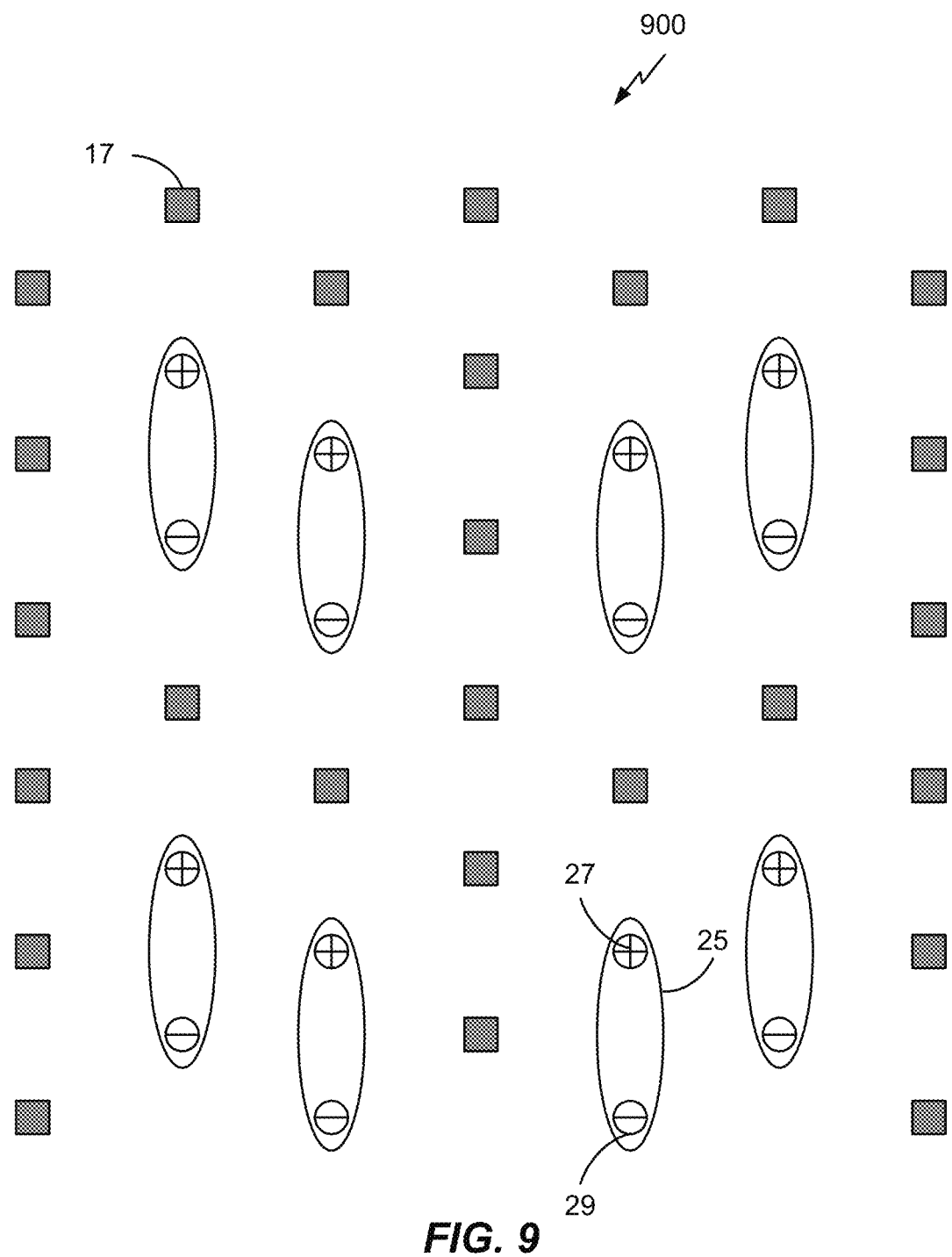
FIG. 9 illustrates another example pin pattern that leverages differential cancellation.

FIG. 9 illustrates another example pin pattern 900 that also partially leverages differential cancellation. The pin pattern 900 may each be a pin pattern of a semiconductor package such as an SoC. The pin pattern 900 may include a plurality of isolation pins 17 and a plurality of differential signal pairs 25. Each differential signal pair 25 may include two signal pins—a first signal pin 27 carrying a first differential signal and a second signal pin 29 carrying a second differential signal complementary to the first differential signal.

The plurality of pins (isolation pins 17, signal pins 27, 29) maybe arranged in an interstitial pattern. That is, the pins may be arranged in rows and columns such that the pins in each row are staggered or offset in a row direction relative to the pins in adjacent rows, and the pins in each column are staggered or offset in a column direction relative to pins in adjacent columns.

The pins of the pin pattern 900 may have immediate neighbor pins. Preferably, for each pin that has a plurality of immediate neighbor pins, that pin is equidistant or substantially equidistant from each of its immediate neighbor pins. Also preferably, a distance between any two immediate neighbor pins is equal to a distance between any other two immediate neighbor pins.

Not all pins of the semiconductor package are shown. That is, the illustrated pin pattern 900 may be a representative portion of a pinout of an exemplary 2×16 HSIO segment. The pin pattern 900 may be repeated horizontally and/or vertically. With the proposed pin pattern 900, the signal-to-pin ratio of the example package may be 0.44 or higher, which is greater than that of the pin pattern 200. The pin count for the package utilizing the pin pattern 900 may be 384 or lower, which includes all ground isolation rows and columns. This represents a reduction of at least 28 pins relative to the pin pattern 200 for the same 2×16 segments.

In terms of preference, the pin pattern 900 may be in between the pin patterns 300 and 500-800 of FIGS. 3A, 3B and 5-8 and the conventional pin patterns 100, 200 of FIGS. 1-2. The pin pattern 900 may be more preferred than the conventional pin pattern 100 due to higher isolation characteristics, and more preferred than the conventional pin pattern 200 due to the lower pin count.

With the pin pattern 900, the number of aggressors can be reduced to zero for some of the signal pins 27, 29. However, it cannot be reduced to zero for all signal pins 27, 27. As seen, some signal pins 27, 29 will have one as the net number of aggressors. Therefore, the pin pattern 900 may be less preferred than the pin patterns 300 and 500-800.

In FIG. 9, the differential signal pairs 25 are in groups of two, and each pair group is isolated from other pair groups by the isolation pins 17. Therefore, the pin pattern 900 may also be referred to as a "pairs isolated in groups of two" pattern 900.

Figure 10:
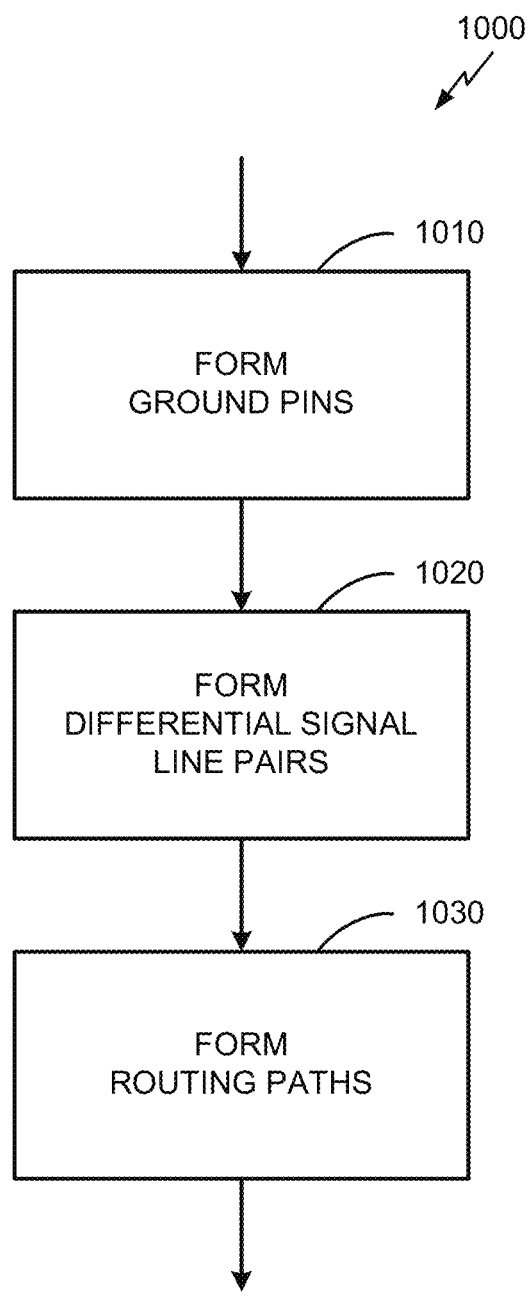
FIG. 10 illustrates a flow chart of an example method for forming a pin pattern.

FIG. 10 illustrates a flow chart of an example method 1000 for forming a pin pattern such as pin patterns 300 and 500-900. It should be noted that not all illustrated blocks of FIG. 10 need to be performed, i.e., some blocks may be optional. Also, the numerical references to the blocks in FIG. 10 should not be taken as requiring that the blocks should be performed in a certain order. Indeed, some blocks may be performed concurrently.

In block 1010, the plurality of isolation pins 17 may be formed. In block 1020, the plurality of differential signal pairs 25 may be formed. In block 1030, routing paths 55 may be formed. The pin patterns 300, 500-900 may be formed such that the plurality of pins are arranged in rows and columns in an interstitial pattern such that pins in each row are offset in a row direction relative the pins in adjacent rows, and pins in each column are offset in a column direction relative to the pins in adjacent columns.

In forming the pin patterns 300, 500-900, the plurality of differential signal pairs 25 may be arranged such that the first signal pin 27 and/or the second signal pin 29 of each differential signal pair 25 is an immediate neighbor pin of the first signal pin 27 and/or the second signal pin 29 of at least one other differential signal pair 25. The plurality of differential signal pairs 25 may also be arranged such that a net number of aggressor pins 35A is zero for each of the first and second signal pins 27, 29 of each differential signal pair 25. Other characteristics of the pin patterns 300, 500-900 are described in detail above, and will not be repeated here for brevity.

Figure 11:
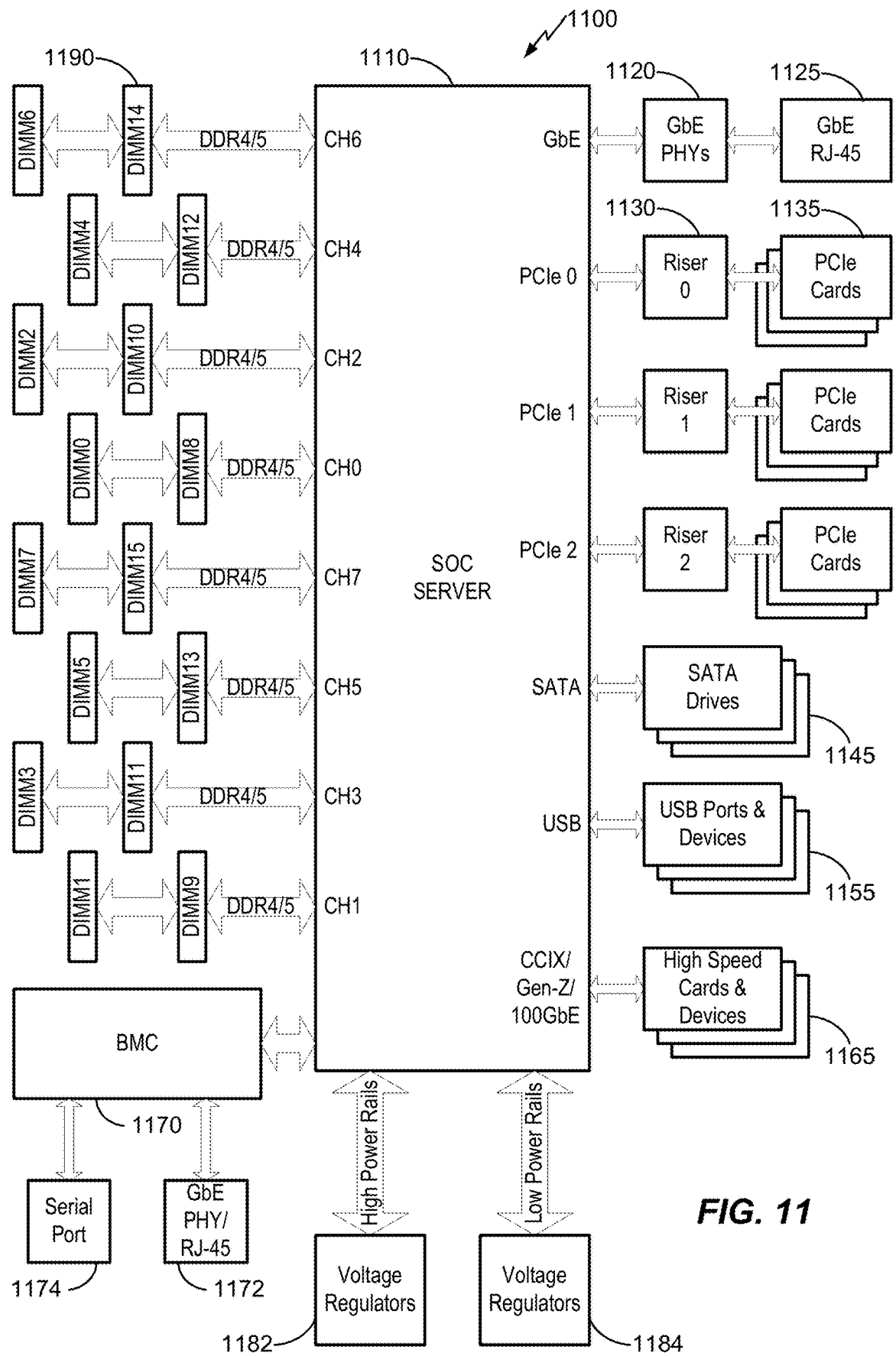
FIG. 11 illustrates one or more devices that incorporate pin patterns leveraging differential cancellation.

FIG. 11 illustrates a system 1100 of one or more devices that incorporate pin patterns leveraging differential cancellation. The system 1100 may include an SoC server 1110 powered by voltage regulators 1182, 1184. The SoC server 1110 may be connected to a plurality of devices through a plurality of interfaces. The SoC server 1110 may be connected to a gigabit Ethernet (GbE) PHY 120 and the a GbE RJ-45 card 1125 through a GbE interface, connected to one or more PCIe risers 130 and one or more PCIe cards 1135 through one or more PCIe interfaces (three shown in FIG. 11), connected to one or more SATA drives 1145 through a SATA interface, connected to one or more USB ports and devices 1155 through a USB port, and connected to one or more high speed cards and devices 1165 through CCIX and/or Gen-Z and/or 100 GbE interfaces. The SoC server 110 may also access a plurality of DIMMs 1190 through a plurality of channel interfaces (CH0-CH7 in FIG. 11). The SoC server 1110 may further connect to a baseboard management controller (BMC) 1170, which in turn may be connected a serial port 1174 and GbE PHY/RJ-45 1172. Any one or more of the interfaces—GbE, PCIe, SATA, USB, CCIX/Gen-Z/100 GbE—of the SoC server 1100 may benefit from implementing the pin patterns that leverage differential cancellation such as the pin patterns 300, 500-900. The benefits may be especially enhanced for high speed interfaces such as the PCIe (e.g., Gen5 and higher) and the CCIX, Gen-Z, and 100 GbE interfaces.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer-readable media embodying any of the devices described above. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. An apparatus, comprising:
 a pin pattern comprising a plurality of pins arranged in rows and columns in an interstitial pattern such that pins in each row are offset in a row direction relative the pins in adjacent rows, and pins in each column are offset in a column direction relative to the pins in adjacent columns,
 wherein the plurality of pins comprise:
  a plurality of isolation pins; and
  a plurality of differential signal pairs, each differential signal pair comprising a first signal pin and a second signal pin, the first signal pin configured to carry a first differential signal, and the second signal pin configured to carry a second differential signal complementary to the first differential signal,
 wherein the first signal pin and/or the second signal pin of each differential signal pair is an immediate neighbor pin of the first signal pin and/or the second signal pin of at least one other differential signal pair, and
 wherein a net number of aggressor pins is zero for each of the first and second signal pins of each differential signal pair.

2. The apparatus of claim 1,
 wherein each pin has a plurality of immediate neighbor pins, wherein each pin is equidistant or substantially equidistant from each of its immediate neighbor pins, and wherein a distance between any two immediate neighbor pins is equal to a distance between any other two immediate neighbor pins.

3. The apparatus of claim 1, wherein the plurality of differential signal pairs are arranged such that the net number of aggressor pins is zero for each of the first and second signal pins of each differential signal pair through differential cancellation.

4. The apparatus of claim 3, wherein a signal pin of at least one differential signal pair has as its immediate neighbor pins both the first and second signal pins of at least one other differential signal pair, the signal pin being one of the first signal pin and the second signal pin of the at least one differential signal pair, wherein the signal pin of the at least one differential signal pair is equidistant or substantially equidistant to both the first and second signal pins of the at least one other differential signal pair such that first and second crosstalk effects cancel each other at the signal pin of the at least one differential signal pair, and wherein the first crosstalk effect is a crosstalk effect due to a signal carried on the first signal pin of the at least one other differential signal pair, and the second crosstalk effect is a crosstalk effect due to a signal carried on the second signal pin of the at least one other differential signal pair.

5. The apparatus of claim 3, wherein both the first and second signal pins of at least one differential signal pair have as one of their immediate neighbor pins a signal pin of at least one other differential signal pair, the signal pin being one of the first signal pin and the second signal pin of the at least one other differential signal pair, wherein the first and second signal pins of the at least one differential signal pair are equidistant to the signal pin of the at least one other differential signal pair such that first and second crosstalk effects are canceled at the at least one differential signal pair, and wherein the first crosstalk effect is a crosstalk effect due to a signal carried on the signal pin of the at least one other differential signal pair and experienced at the first signal pin of the at least one differential signal pair, and the second crosstalk effect is a crosstalk effect due to the signal carried on the signal pin of the at least one other differential signal pair and experienced at the second signal pin of the at least one differential signal pair.

6. The apparatus of claim 1, wherein the pin pattern is repeated vertically, horizontally, or both.

7. The apparatus of claim 1, wherein a signal-to-pin ratio is at least 0.4.

8. The apparatus of claim 1, wherein the pin pattern is for a 2×16 HSIO (high speed input/output) segment, and wherein a pin count for the 2×16 HSIO segment of the pin pattern is less than a pin count for 2×16 HSIO segment of a CCIX (Cache Coherent Interconnect for Accelerators) pin pattern.

9. The apparatus of claim 8, wherein the pin count for the 2×16 HSIO segment of the pin pattern is 384 or less.

10. The apparatus of claim 1, wherein the pin pattern is configured to operate at a speed of at least 25 Gbps (gigabits per second).

11. The apparatus of claim 1, further comprising a plurality of routing paths configured to couple the plurality of differential signal pairs to outside of the apparatus, wherein each routing path corresponds to one of the differential signal pairs, and wherein the plurality of routing paths are provided in a layer of the apparatus.

12. The apparatus of claim 1, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, a networking device, a co-processing device, a storage device and a device in an automotive vehicle.

13. A method, comprising:

forming a pin pattern of an apparatus, the pin pattern comprising a plurality of pins, wherein forming the pin pattern comprises:

forming a plurality of isolation pins of the of pin pattern; and forming a plurality of differential signal pairs of the pin pattern such that each differential signal pair comprises a first signal pin configured to carry a first differential signal and a second signal pin configured to carry a second differential signal complementary to the first differential signal, wherein the pin pattern is formed such that the plurality of pins are arranged in rows and columns in an interstitial pattern such that pins in each row are offset in a row direction relative the pins in adjacent rows, and pins in each column are offset in a column direction relative to the pins in adjacent columns, and wherein the plurality of differential signal pairs are arranged such that the first signal pin and/or the second signal pin of each differential signal pair is an immediate neighbor pin of the first signal pin and/or the second signal pin of at least one other differential signal pair, and a net number of aggressor pins is zero for each of the first and second signal pins of each differential signal pair.

14. The method claim 13, wherein the pin pattern is formed such that each pin has a plurality of immediate neighbor pins, each pin is equidistant or substantially equidistant from each of its immediate neighbor pins, and a distance between any two immediate neighbor pins is equal to a distance between any other two immediate neighbor pins.

15. The method claim 13, wherein the plurality of differential signal pairs are arranged such that the net number of aggressor pins is zero for each of the first and second signal pins of each differential signal pair through differential cancellation.

16. The method of claim 15, wherein the plurality of differential signal pairs are arranged such that a signal pin of at least one differential signal pair has as its immediate neighbor pins both the first and second signal pins of at least one other differential signal pair, the signal pin being one of the first signal pin and the second signal pin of the at least one differential signal pair, and the signal pin of the at least one differential signal pair is equidistant or substantially equidistant to both the first and second signal pins of the at least one other differential signal pair such that first and second crosstalk effects cancel each other at the signal pin of the at least one differential signal pair, the first crosstalk effect being a crosstalk effect due to a signal carried on the first signal pin of the at least one other differential signal pair, and the second crosstalk effect being a crosstalk effect due to a signal carried on the second signal pin of the at least one other differential signal pair.

17. The method of claim 15, wherein the plurality of differential signal pairs are arranged such that both the first and second signal pins of at least one differential signal pair have as one of their immediate neighbor pins a signal pin of at least one other differential signal pair, the signal pin being one of the first signal pin and the second signal pin of the at least one other differential signal pair, and the first and second signal pins of the at least one differential signal pair are equidistant or substantially equidistant to the signal pin of the at least one other differential signal pair such that first and second crosstalk effects are canceled at the at least one differential signal pair, the first crosstalk effect being a crosstalk effect due to a signal carried on the signal pin of the at least one other differential signal pair and experienced at the first signal pin of the at least one differential signal pair, and the second crosstalk effect being a crosstalk effect due to the signal carried on the signal pin of the at least one other differential signal pair and experienced at the second signal pin of the at least one differential signal pair.

18. The method of claim 13, wherein forming the pin pattern is repeated vertically, horizontally, or both.

19. The method of claim 13, wherein the pin pattern is for a 2×16 HSIO (high speed input/output) segment, and wherein the pin pattern is formed such that a pin count for the 2×16 HSIO segment of the pin pattern is less than a pin count for 2×16 HSIO segment of a COX (Cache Coherent Interconnect for Accelerators) pin pattern.

20. The method of claim 13, further comprising forming a plurality of routing paths configured to couple the plurality of differential signal pairs to outside of the apparatus, wherein each routing path corresponds to one of the differential signal pairs, and wherein the plurality of routing paths are provided in a layer of the apparatus.

* * * * *